(12) United States Patent
Shih

(10) Patent No.: US 10,903,110 B2
(45) Date of Patent: Jan. 26, 2021

(54) METHOD OF FORMING FINE INTERCONNECTION FOR A SEMICONDUCTOR DEVICE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 2 days.

(21) Appl. No.: 16/257,021

(22) Filed: Jan. 24, 2019

(65) Prior Publication Data

US 2020/0185268 A1 Jun. 11, 2020

Related U.S. Application Data

(60) Provisional application No. 62/775,918, filed on Dec. 6, 2018.

(51) Int. Cl.
*H01L 21/768* (2006.01)
(52) U.S. Cl.
CPC .. *H01L 21/76814* (2013.01); *H01L 21/76877* (2013.01)

(58) Field of Classification Search
CPC ............ H01L 24/72; H01L 25/071; H01L 2924/10254; H01L 2924/10272; H01L 2924/1033; H01L 2924/1203; H01L 2924/13055
See application file for complete search history.

(56) References Cited

U.S. PATENT DOCUMENTS 9,741,614 B1* 8/2017 Kuo ................... H01L 21/31144
2019/0148159 A1* 5/2019 Huang .............. H01L 21/30604
438/689

* cited by examiner

*Primary Examiner* — Zandra V Smith
*Assistant Examiner* — Andre C Stevenson
(74) *Attorney, Agent, or Firm* — CKC & Partners Co., LLC

(57) ABSTRACT

A method of forming fine interconnection includes: forming spacers on a first and second hard mask layer on a dielectric layer; forming a first via hole through the first hard mask layer, the second hard mask layer, and the dielectric layer; oxidizing a sidewall of the first hard mask layer that surrounding the via hole; forming a second via hole in the second hard mask layer; forming a mask to cover the first hard mask layer in the second via hole; forming a line trench in a portion of the second hard mask layer exposed by the spacers and the mask, and in the first hard mask layer and the dielectric layer that are below the portion of the second hard mask layer; and forming a conductive material in the line trench and the first via hole.

12 Claims, 14 Drawing Sheets

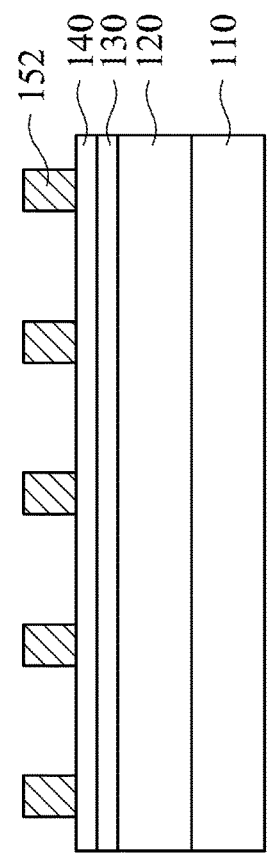
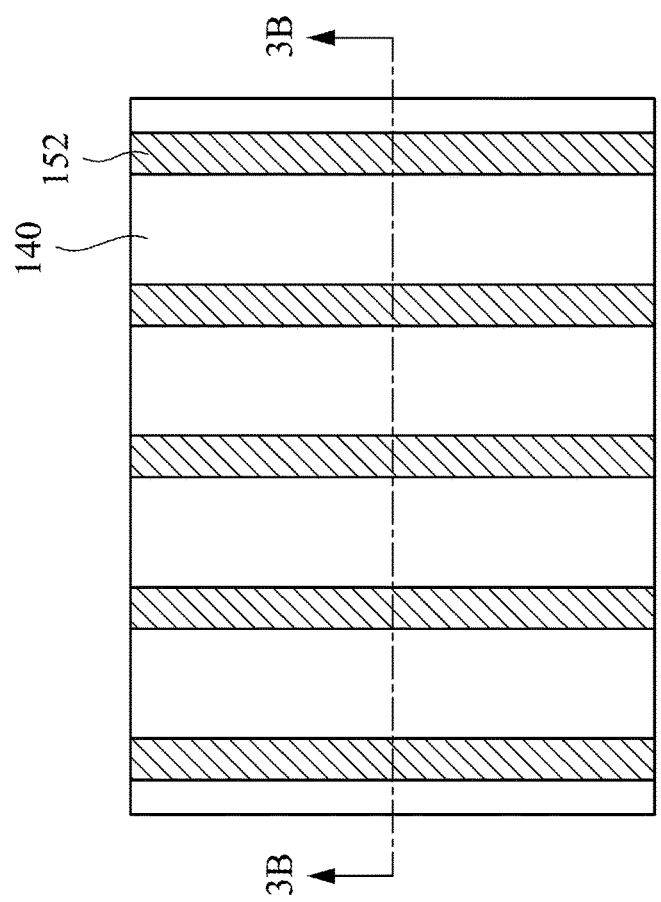
Fig. 3B
Fig. 3A

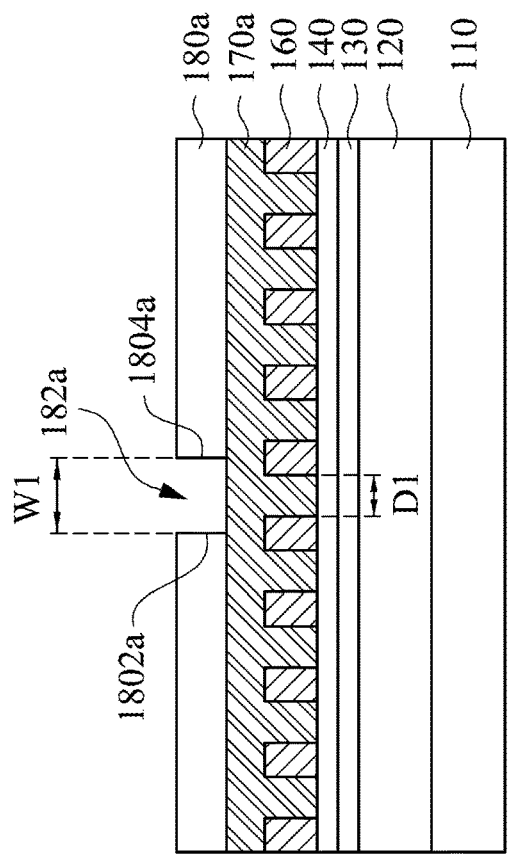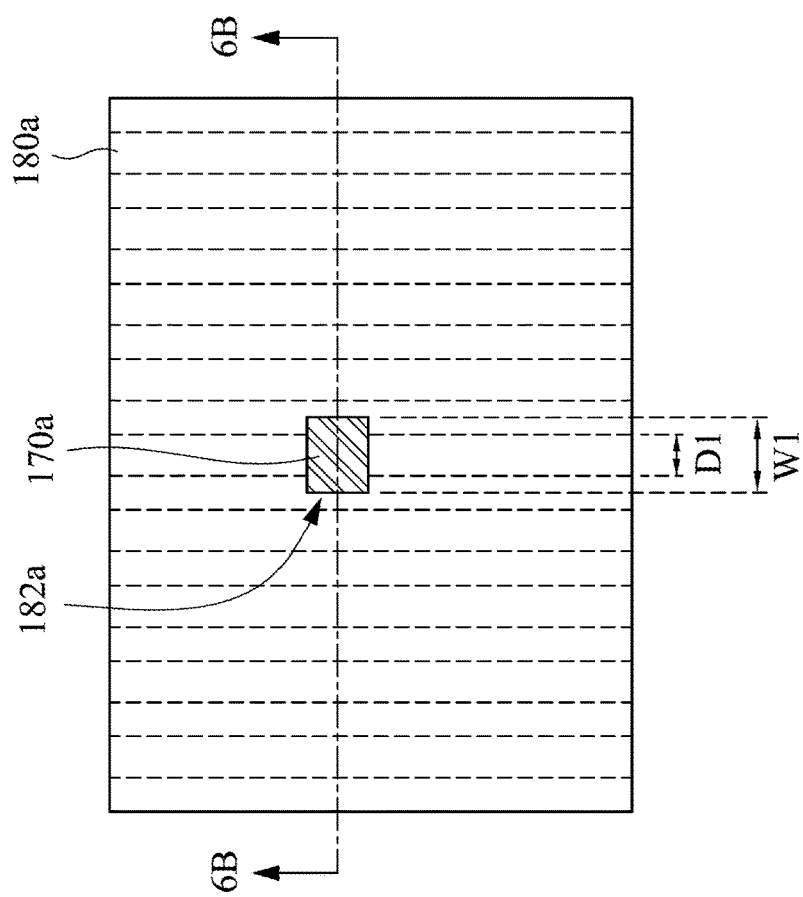
Fig. 6B
Fig. 6A

METHOD OF FORMING FINE INTERCONNECTION FOR A SEMICONDUCTOR DEVICE

RELATED APPLICATIONS

This application claims priority to U.S. Provisional Application Ser. No. 62/775,918, filed Dec. 6, 2018, which is herein incorporated by reference in its entirety.

BACKGROUND

Field of Invention

The present disclosure relates to a method of forming fine interconnection for a semiconductor device.

Description of Related Art

As the degree of integration of semiconductor devices increases, various double patterning technologies for forming fine interconnections having a pitch smaller than the minimum resolution of a photolithography process have been developed.

However, alignment between a plurality of metal line cuts and conductive via holes is still a significant problem, such as when the pitch between metal lines is no longer than 40 nanometers.

SUMMARY

An aspect of the present disclosure is to provide a method of forming fine interconnection for a semiconductor device.

According to some embodiments of the disclosure, the method of forming fine interconnection for a semiconductor device includes: forming a plurality of spacers on a first and second hard mask layer on a dielectric layer, the first hard mask layer is between the second hard mask layer and the dielectric layer; forming a first via hole through the first hard mask layer, the second hard mask layer, and the dielectric layer; oxidizing a sidewall of the first hard mask layer that surrounding the via hole; forming a second via hole in the second hard mask layer; forming a mask to cover the first hard mask layer that is in the second via hole; forming a line trench in a portion of the second hard mask layer exposed by the spacers and the mask, and in the first hard mask layer, and the dielectric layer that are below the portion of the second hard mask layer; and forming a conductive material in the line trench and the first via hole.

In some embodiments of the disclosure, the forming the via hole further includes: forming a planarization layer to cover the spacers and the second hard mask layer; forming a photoresist layer on the planarization layer; and forming an opening in the photoresist layer, wherein the opening is above at least two adjacent spacers, and the first via hole is below the opening.

In some embodiments of the disclosure, the method further includes: removing the planarization layer and the photoresist layer after forming the first via hole.

In some embodiments of the disclosure, oxidizing the sidewall of the first hard mask layer is performed by oxygen plasma.

In some embodiments of the disclosure, forming the second via hole further includes: forming a planarization layer to cover the spacers, the first via hole, and the second hard mask layer; forming a photoresist layer on the planarization layer; and forming an opening in the photoresist layer, wherein the opening is above at least two adjacent spacers, and the second via hole is below the opening.

In some embodiments of the disclosure, the mask is made of a material comprises metal oxide.

In some embodiments of the disclosure, the method further includes: forming a planarization layer to fill the first via hole and cover the spacers, the mask, and the second hard mask layer after forming the mask.

In some embodiments of the disclosure, the method further includes removing the planarization layer until the mask and the second hard mask layer are exposed, such that a remaining portion of the planarization layer is in the first via hole.

In some embodiments of the disclosure, forming the line trench such that a top surface of the remaining portion of the planarization layer is lower than the second hard mask layer.

In some embodiments of the disclosure, the method further includes: removing the first and the second hard mask layer, the mask, and the planarization layer in the first via hole.

In some embodiments of the disclosure, the method further includes: forming a core layer on the second hard mask layer; and patterning the core layer.

In some embodiments of the disclosure, forming the spacers on the first and second hard mask layer further includes: forming the spacers on a sidewall of the patterned core layer; and removing the patterned core layer.

In the aforementioned embodiments, the method of forming fine interconnections for a semiconductor device can form fine pattern of interconnections, and the alignment between metal lines and via holes for the fine interconnections with small pitches (e.g., no longer than 40 nanometers) can be achieved.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows:

FIGS. 2-15B are cross-sectional views and top views of a method of forming fine interconnection of a semiconductor device at various stages according to some embodiments of the present disclosure.

DETAILED DESCRIPTION

Figure 1:
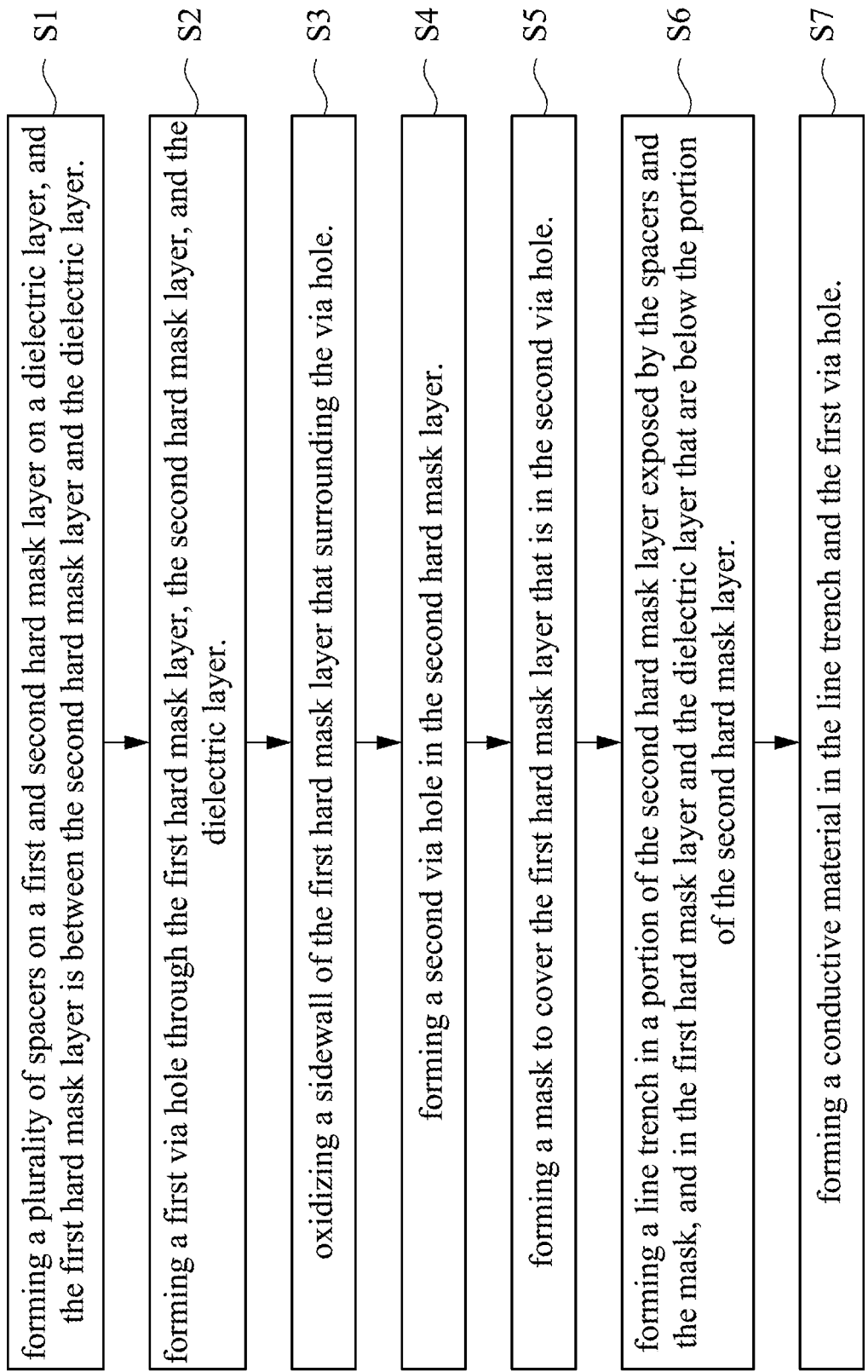
FIG. 1 is a flow chart of a method of forming fine interconnection of a semiconductor device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a flow chart of the method of forming fine interconnection for a semiconductor device. The method starts with step S1 in which a plurality of spacers is formed on a first and second hard mask layer on a dielectric layer, and the first hard mask layer is between the second hard mask layer and the dielectric layer. Thereafter, in step S2, a first via hole is formed through the first hard mask layer, the second hard mask layer, and the dielectric layer. Next, in step S3, a sidewall of the first hard mask layer that surrounds the via hole is oxidized. Afterwards, in step S4: a second via hole is formed in the second hard mask layer. Subsequently, in step S5, a mask is formed to cover the first hard mask layer that is in the second via hole. Thereafter, in step S6, a line trench is formed in a portion of the second hard mask exposed by the spacers and the mask, and in the first hard mask layer and the dielectric layer that are below the portion of the second hard mask layer. Next, in step S7, a conductive material is formed in the line trench and the first via hole. In the following description, the aforementioned steps will be described in detail.

Figure 2:
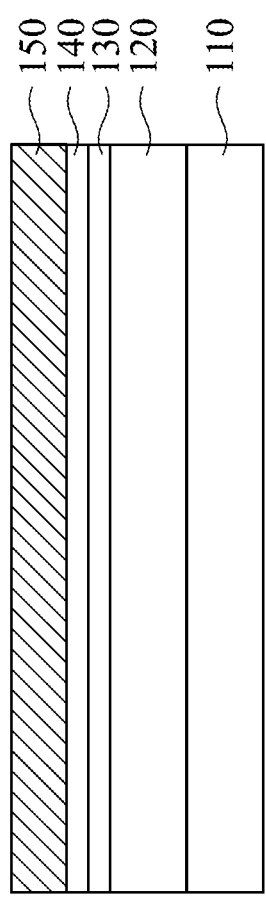

Reference is made to FIG. 2. In some embodiments, a dielectric layer 120, a first hard mask layer 130, and a second hard mask layer 140 are sequentially formed on a substrate 110. The first hard mask layer 130 is between the dielectric layer 120 and the second hard mask layer 140. Thereafter, a core layer 150 is formed on the second hard mask layer 140.

In some embodiments, the dielectric layer 120 may include silicon oxide ($SiO_2$) or low-k dielectric material. The first hard mask layer 130 may be made of a material including silicon (Si). In some other embodiments, the first hard mask layer 130 may be made of a material including titanium (Ti), titanium nitride (TiN), tungsten nitride (WN), or titanium oxide (TiO). In addition, the second hard mask layer 140 may be made of a material including silicon monoxide (SiO), silicon nitride (SiN), and Si, etc. In some embodiments, the core layer 150 may be formed by deposition, and may be made of a material including polymer, $SiO_2$, SiN, Si, etc.

References are made to FIG. 3A and FIG. 3B. FIG. 3B is a cross-sectional view taken along line 3B-3B of FIG. 3A. After the core layer 150 is formed on the second hard mask layer 140, the core layer 150 is patterned to form core liners 152.

Figure 4:
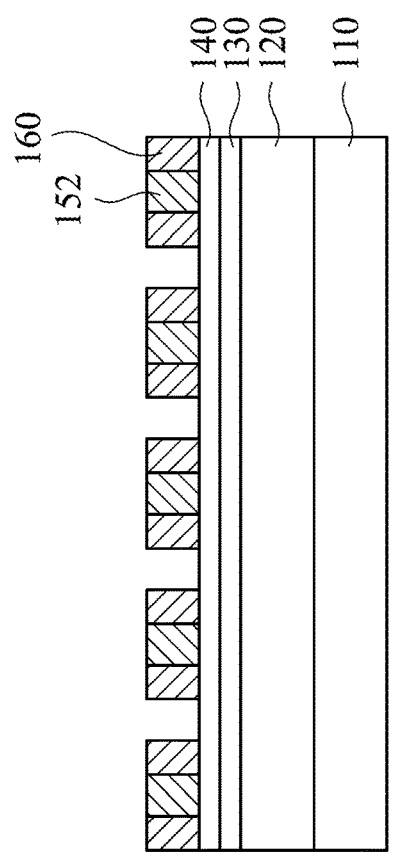

References are made to FIG. 4 and step S1 of FIG. 1. Spacers 160 are formed on the second hard mask layer 140. Before the spacers 160 are formed, a spacer layer (not shown) may be blanket formed first on top surfaces and sidewalls of the core liner 152 and on top surfaces of the second hard mask layer 140 by Atomic layer deposition (ALD). The portions of the spacer layer on the top surfaces of the core liner 152 and the top surfaces of the second hard mask layer 140 are later removed by etching horizontal portions of the spacer layer 160. Thereafter, the remaining portions of the spacer layer on sidewalls of the core liners 152 are the spacers 160. In some embodiments, the spacer layer may be made of a material including SiO, SiN, TiO, etc.

Figure 5:
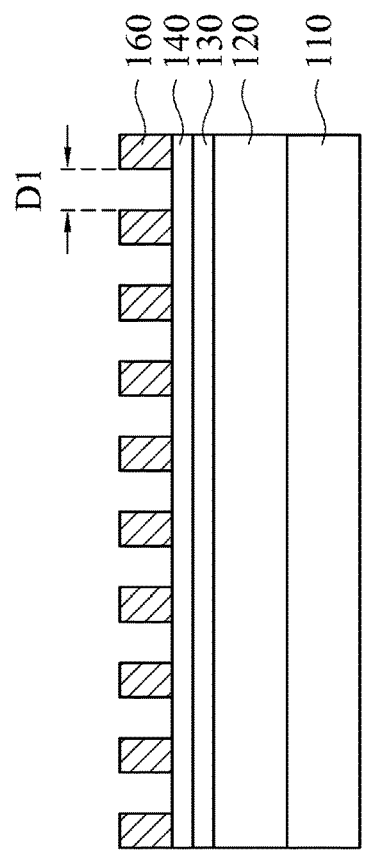

Reference is made to FIG. 5. The core liners 152 are then removed. In some embodiments, removing of the core liner 152 may be performed by selective etching. In the present embodiment, a distance D1 is between adjacent two spacers 160.

References are made to FIG. 6A and FIG. 6B. FIG. 6B is a cross-sectional view taken along line 6B-6B of FIG. 6A. A planarization layer 170a is formed to cover the spacers 160 and the second hard mask layer 140. A photoresist layer 180a is formed on the planarization layer 170a after the planarization layer 170a is formed. Thereafter, an opening 182a is formed in the photoresist layer 180a to expose the planarization layer 170a. The opening 182a is above at least two adjacent spacers 160. In this embodiment, the sidewalls 1802a, 1804a of the photoresist layer 180a surrounding the opening 182a are substantially aligned with the two adjacent spacers 160, respectively.

For example, the opening 182a has a width W1 that is greater than the distance D1 between the two adjacent spacers 160. In some embodiments, the sidewall 1802a and the sidewall 1804a are substantially aligned with the centers of the two spacers 160, but the disclosure is not limited in this regard.

Figure 7:
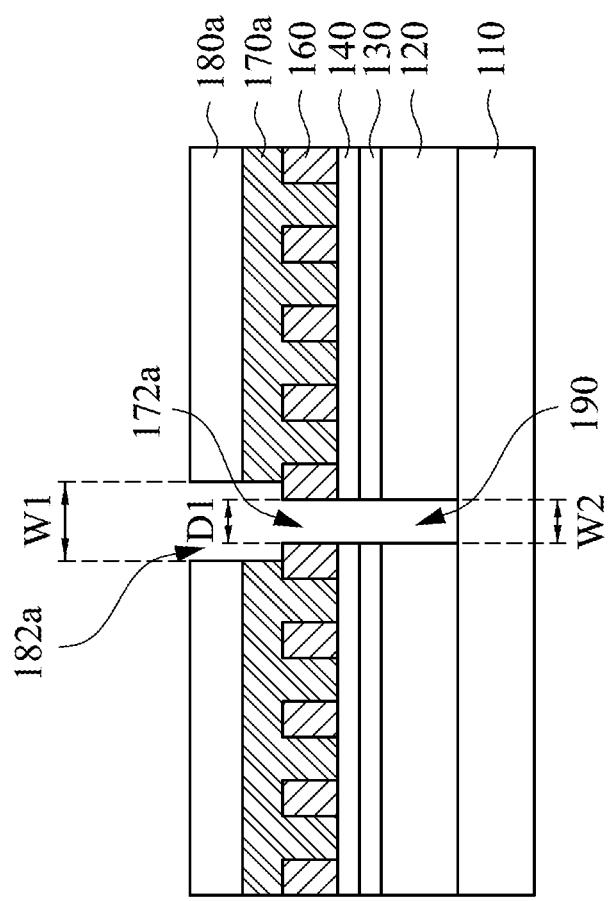

References are made to FIG. 7 and step S2 of FIG. 1. A first via hole 190 through the second hard mask layer 140, the first hard mask layer 130, and the dielectric layer 120 is formed. The first via hole 190 is below the opening 182a.

In some embodiments, before the first via hole 190 is formed, the planarization layer 170a may be patterned by the opening 182a to form an opening 172a in the planarization layer 170. After the opening 172a is formed, the second hard mask layer 140, the first hard mask layer 130, and the dielectric layer 120 may be sequentially patterned by the opening 172a to form the first via hole 190. That is, the opening 172a is below the opening 182a, and the first via hole 190 is below the opening 172a, and the openings 182a, 172a, and the first via hole 190 are communicated with each other.

As shown in FIG. 7, the opening 172a includes an upper portion above the two spacers 160 and a lower portion between the two spacers 160. The width of the upper portion of the opening 172a is substantially the same as the width W1 of the opening 182a. The width of the lower portion of the opening 172a is substantially the same as the distance D1 between the two adjacent spacers 160.

The first via hole 190 has a width W2 that is substantially the same as the distance D1 between the two adjacent spacers 160 or the width of the lower portion of the opening 172a. The width W2 of the first via hole 190 is smaller than the width W1 of the opening 182a and the width of the upper portion of the opening 172a.

Figure 8B:
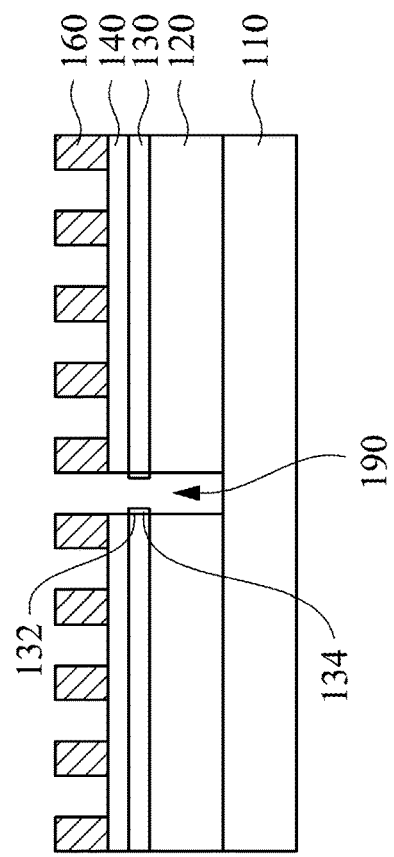
Figure 8A:
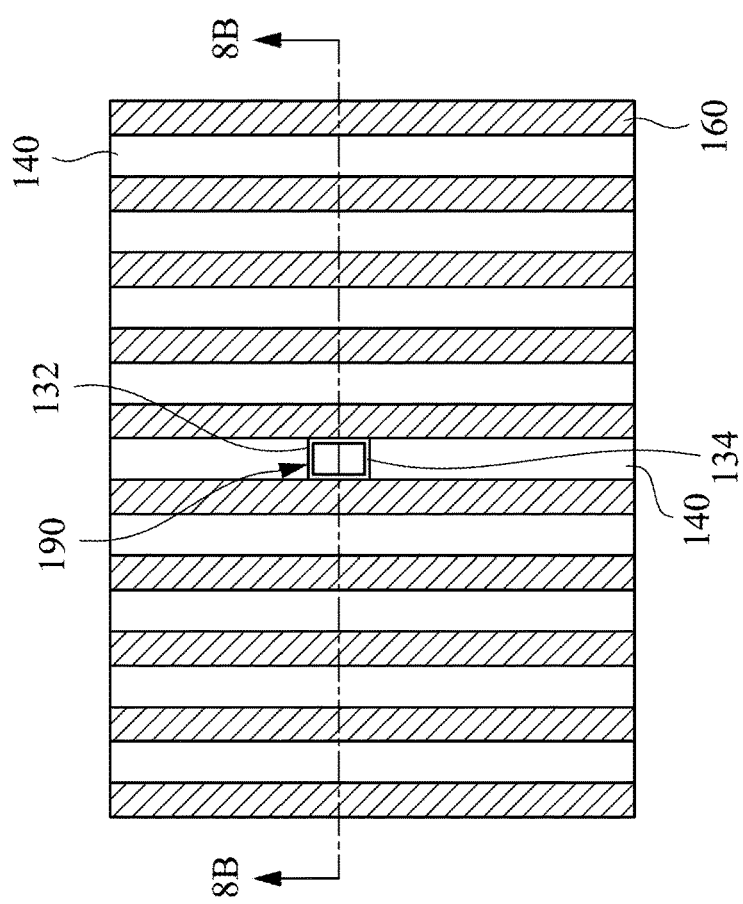

References are made to FIG. 8A and FIG. 8B. FIG. 8B is a cross-sectional view taken along line 8B-8B of FIG. 8A. After the first via hole 190 is formed, the planarization layer 170a and the photoresist layer 180a are removed. Therefore, the top surface of the second hard mask layer 140 between the spacers 160 is exposed.

In step S3 of FIG. 1, an oxygen plasma is then performed to oxidize the sidewalls 132 of the first hard mask layer 130. In some embodiments, the first hard mask layer 130 is made of a material including Silicon (Si). After the sidewalls 132 of the first hard mask layer 130 are oxidized, thin oxide layers 134 made of $SiO_2$ may be formed on the sidewalls 132 of the first hard mask layer 130. As shown in FIG. 8A, the oxide layer 134 surrounds the first via hole 190. In some other embodiments, the first hard mask layer 130 may be made of a material including metal. After the sidewalls 132 of the first hard mask layer 130 are oxidized, the thin oxide layers 134 made of metal oxide may be formed on the sidewalls 132 of the first hard mask layer 130.

Figures 9A, 9B:
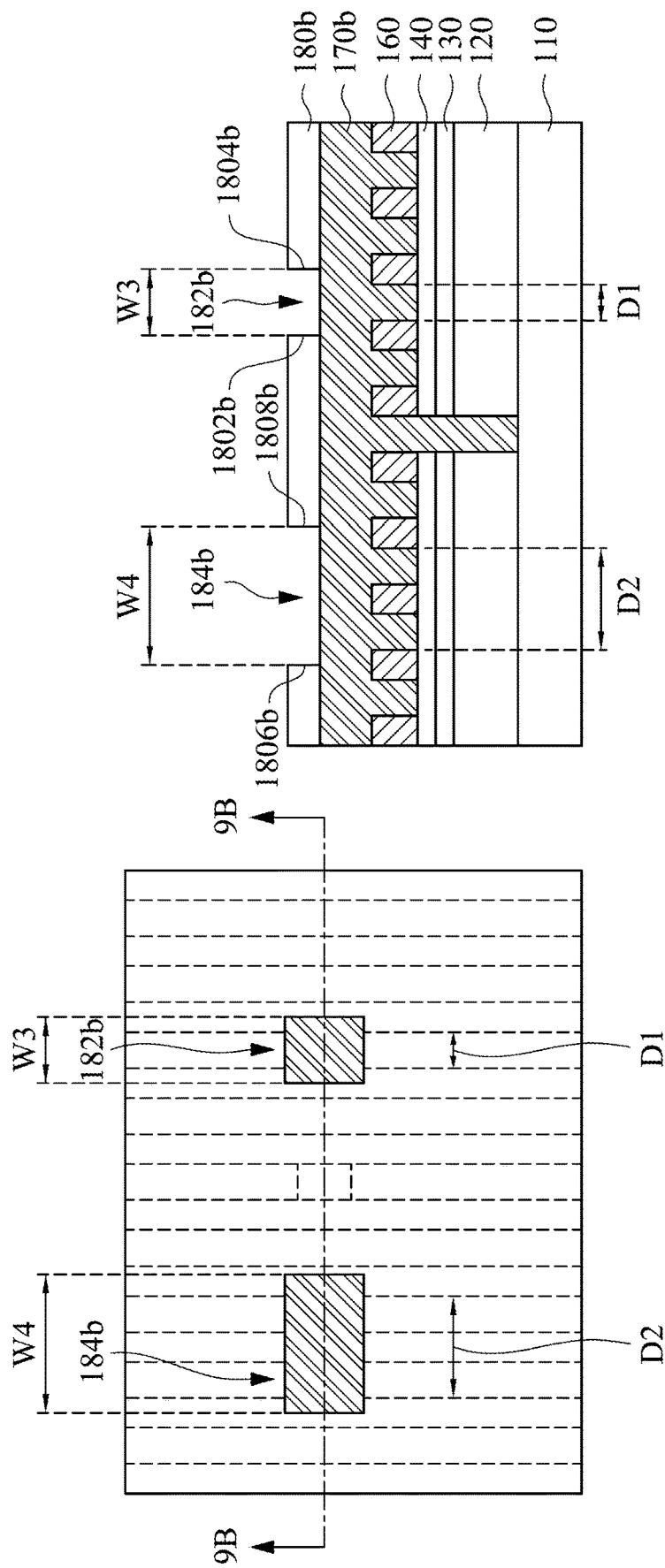

References are made to FIG. 9A and FIG. 9B. FIG. 9B is a cross-sectional view taken along line 9B-9B of FIG. 9A. In some embodiments, another planarization layer 170b is formed to cover the spacers 160, the first via hole 190, and the second hard mask layer 140. A photoresist layer 180b is formed on the planarization layer 170b after the planarization layer 170b is formed. Thereafter, openings 182b and 184b are formed in the photoresist layer 180b to expose the planarization layer 170b.

In this embodiment, the opening 182b is above another two adjacent spacers 160. The sidewalls 1802b, 1804b of the photoresist layer 180b surrounding the opening 182b are substantially aligned with the two adjacent spacers 160, respectively. The opening 182b has a width W3 that is greater than the distance D1 between the two spacers 160.

In this embodiment, the opening 184b is above another three adjacent spacers 160, and the sidewalls 1806b, 1808b of the photoresist layer 180b surrounding the opening 184b are substantially aligned with two of the three spacers 160, respectively. The opening 184b has a width W4 that is greater than the distance D2 between the two spacers 160.

Figure 10:
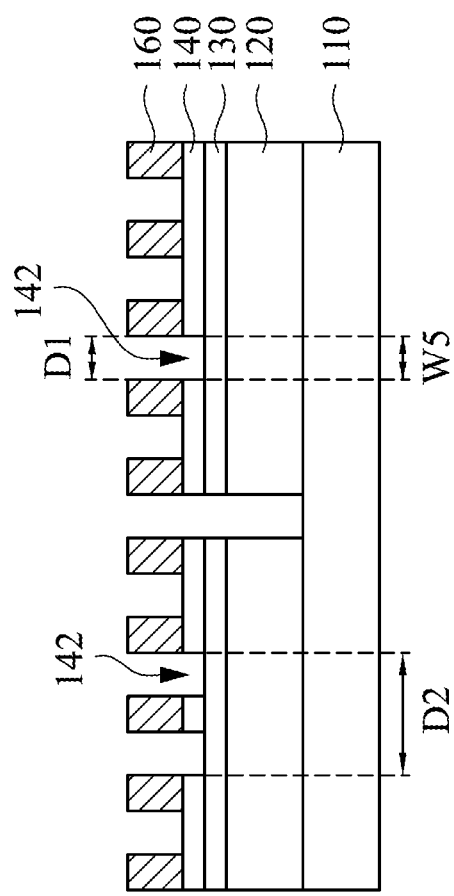

References are made to FIG. 9A, FIG. 9B, FIG. 10 and step S4 in FIG. 1. In some embodiments, three second via holes 142 are formed in the second hard mask layer 140. One of the second via holes 142 is below the opening 182b, and the other two second via holes 142 are below the opening 184b.

In some embodiments, before the second via holes 142 are formed, the planarization layer 170b may be patterned by the opening 182b, 184b to form openings (not shown) in the planarization layer 170b. After the openings are formed in the planarization layer 170b, the second mask layer 140 may be patterned by the openings in the planarization layer 170b to form the second via holes 142.

The second via holes 142 each have a width W5 that is substantially the same as the distance D1 between the two spacers 160 and is smaller than the width W3 of the opening 182b and the width W4 of the opening 184b.

Figure 11:
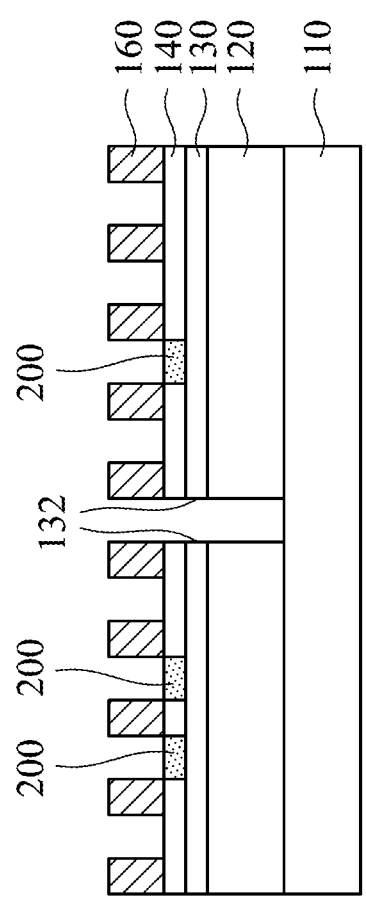

References are made to FIG. 10, FIG. 11 and step S5 of FIG. 1. Masks 200 are formed to cover the first hard mask layer 130 that is in the second via holes 142. The mask 200 is made of a material including metal oxide. Since the sidewalls 132 of the first hard mask 130 are oxidized in step S3, the mask 200 can be selectively formed merely on the portions of the top surface of the first hard mask layer 130 that are exposed through the second via holes 142.

Figure 12:
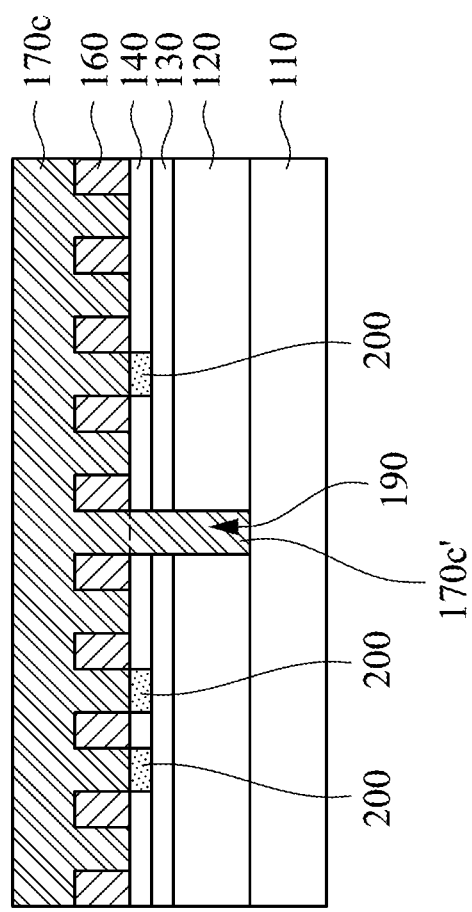

Reference is made to FIG. 12. A planarization layer 170c is formed to fill the first via hole 190 and cover the spacers 160, the mask 200, and the second hard mask layer 140 after the masks 200 are formed. The portion of the planarization layer 170c that is filled in the first via hole 190 may act as a projection material during the subsequent process.

Figures 13A, 13B:
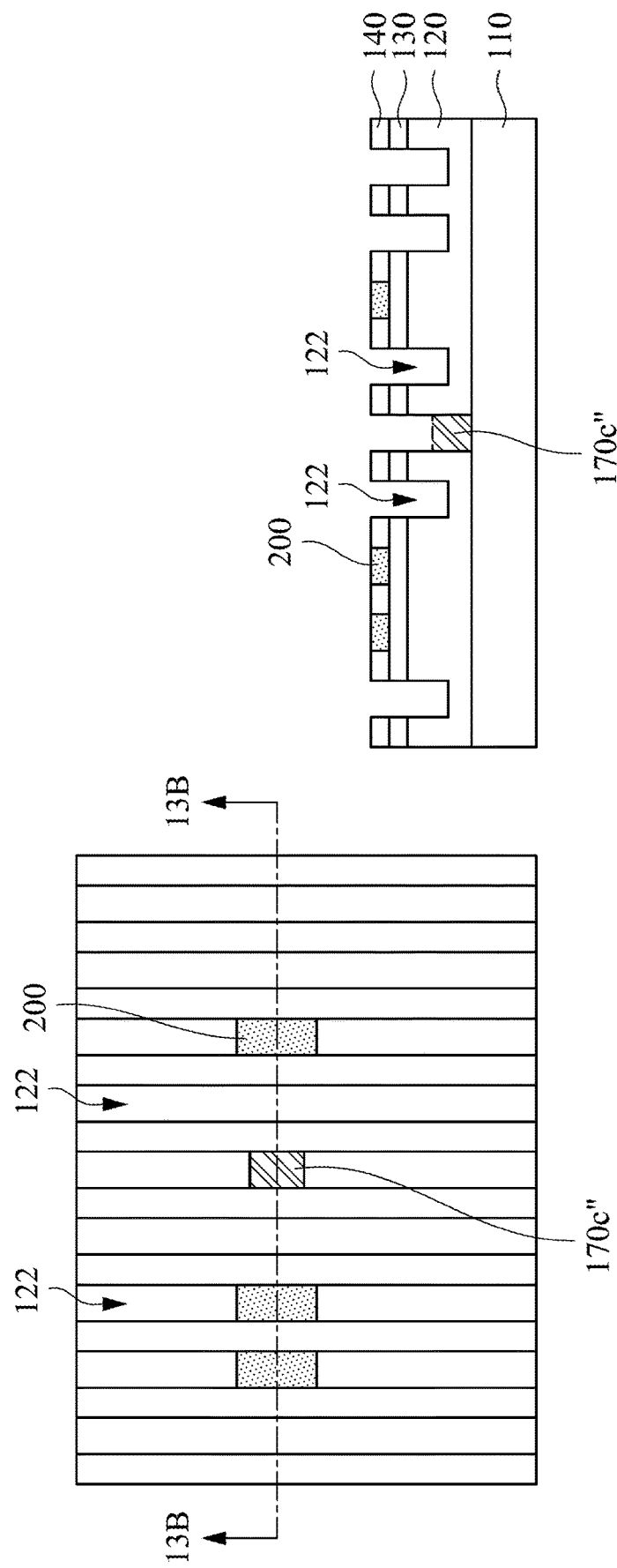

References are made to FIG. 12, FIG. 13A, FIG. 13B, and step S6 of FIG. 1. FIG. 13B is a cross-sectional view taken along line 13B-13B of FIG. 13A. Line trenches 122 are formed in portions of the second hard mask layer 140 exposed by the spacers 160 and the mask 200, and in the first hard mask layer 130 and the dielectric layer 120 below the portions of the second hard mask layer 140.

In some embodiments, before the trench 122 is formed, the planarization layer 170c may be etched until the spacers 160, the mask 200, and the second hard mask layer 140 are exposed. After the planarization layer 170c is etched, a remaining portion 170c' of the planarization layer 170c is left in the first via hole 190.

In the present embodiment, the remaining portion 170c' shown in FIG. 12 fills the first via hole 190. For example, a top surface (illustrated by the dashed line) of the remaining portion 170c' is substantially level with or lower than the second hard mask layer 140.

After the planarization layer 170c is etched, the portions of the second hard mask layer 140 exposed by the spacers 160 and the mask 200 are etched. Thereafter, the portions of the first hard mask layer 130 and the dielectric layer 120 below the etched portions of the second hard mask layer 140 are sequentially etched. The depth of the line trench 122 in the dielectric layer 120 is smaller than the thickness of the dielectric layer 120.

During the etching process for the second hard mask 140, the first hard mask 130, and the dielectric layer 120, the remaining portion 170c' of the planarization layer 170c may be further etched such that a remaining portion 170c" is formed and is lower than the first hard mask 130 or the second hard mask layer 140. In other words, a top surface of the remaining portion 170c" of FIG. 13 (illustrated by the dashed line) is lower than the top surface of the remaining portion 170c' of FIG. 12. Accordingly, the remaining portion 170c" of the planarization layer 170c in the first via hole 190 can protect the substrate 110 below the remaining portion 170c" from being damaged by etching.

As shown in FIG. 13A, one line trench 122 can be cut by the mask 200 by protecting the underlying first hard mask layer 130 and the dielectric layer 120 during etching.

Figure 14:
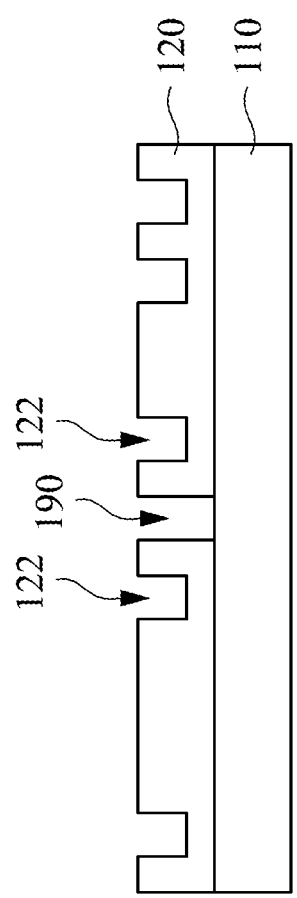

Reference is made to FIG. 14. After the line trenches 122 are formed, the spacers 160, the first hard mask layer 130, the second hard mask layer 140, the mask 200, and the etched remaining portion 170c" of the planarization layer 170c in the first via hole 190 are sequentially removed.

Figures 15A, 15B:
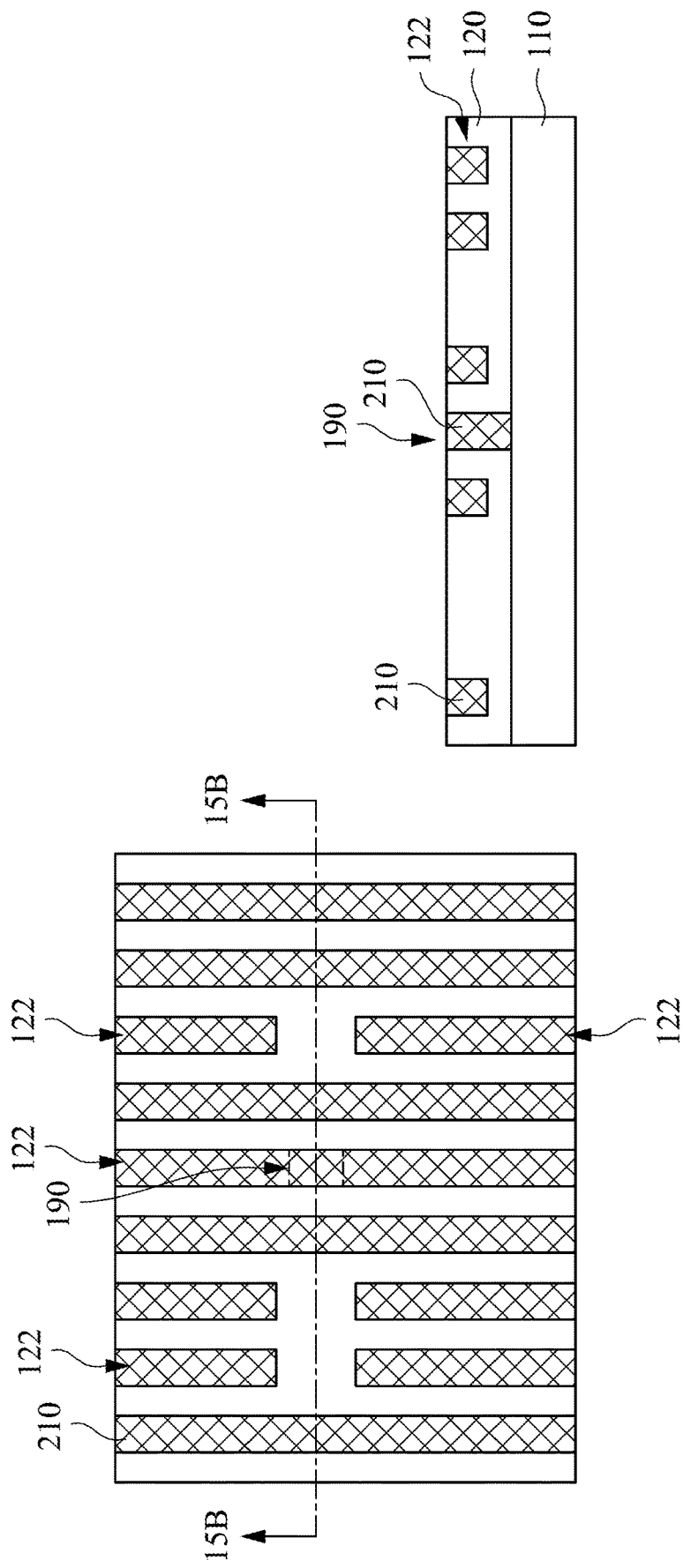

References are made to FIG. 15A, FIG. 15B and step S7 of FIG. 1. FIG. 15B is a cross-sectional view taken along line 15B-15B of FIG. 15A. A conductive material 210 is formed in the line trench 122 and the first via hole 190 to respectively form a metal line and a conductive via hole. Accordingly, the conductive material 210 in the first via hole 190 and the line trenches 122 collectively forms the fine pattern of interconnections.

According to the foregoing embodiments of the disclosure, the via hole for fine interconnections can be formed by via first self-aligned double patterning. The oxidized sidewalls of the second hard mask layer surrounding the via hole can avoid the metal oxide of the mask to block the via hole. Therefore, during the formation of the line trenches, the planarization layer can be filled in the via hole to protect the underlying structures from damage during the etching process. Furthermore, enough overlap windows can be provided for the cutting of the line trenches. Therefore, the alignment of the metal lines and the conductive via hole for the fine interconnections with small pitches (e.g., no longer than 40 nanometers) can be achieved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming fine interconnection for a semiconductor device, comprising:

forming a plurality of spacers on a first and second hard mask layer on a dielectric layer, wherein the first hard mask layer is between the second hard mask layer and the dielectric layer;

forming a first via hole through the first hard mask layer, the second hard mask layer, and the dielectric layer;

oxidizing a sidewall of the first hard mask layer that surrounding the via hole;

forming a second via hole in the second hard mask layer;

selectively forming a mask to cover the first hard mask layer that is in the second via hole such that the second hard mask layer, the side wall of the first hard mask layer, and the dielectric layer in the first via hole are spaced apart from the mask;

forming a line trench in a portion of the second hard mask layer exposed by the spacers, and the mask, and in the first hard mask layer and the dielectric layer that are below the portion of the second hard mask layer; and forming a conductive material in the line trench and the first via hole.

2. The method of claim 1, wherein the forming the via hole further comprising:
   forming a planarization layer to cover the spacers and the second hard mask layer;
   forming a photoresist layer on the planarization layer; and
   forming an opening in the photoresist layer, wherein the opening is above at least two adjacent spacers, and the first via hole is below the opening.

3. The method of claim 2, further comprising:
   removing the planarization layer and the photoresist layer after forming the first via hole.

4. The method of claim 1, wherein oxidizing the sidewall of the first hard mask layer is performed by oxygen plasma.

5. The method of claim 1, wherein forming the second via hole further comprising:
   forming a planarization layer to cover the spacers, the first via hole, and the second hard mask layer;
   forming a photoresist layer on the planarization layer; and
   forming an opening in the photoresist layer, wherein the opening is above at least two adjacent spacers, and the second via hole is below the opening.

6. The method of claim 1, wherein the mask is made of a material comprises metal oxide.

7. The method of claim 1, further comprising:
   forming a planarization layer to fill the first via hole and cover the spacers, the mask, and the second hard mask layer after forming the mask.

8. The method of claim 7, further comprising:
   removing the planarization layer until the mask and the second hard mask layer are exposed, such that a remaining portion of the planarization layer is in the first via hole.

9. The method of claim 8, wherein forming the line trench such that a top surface of the remaining portion of the planarization layer is lower than the second hard mask layer.

10. The method of claim 1, further comprising:
    removing the first and the second hard mask layer, the mask, and the planarization layer in the first via hole.

11. The method of claim 1, further comprising:
    forming a core layer on the second hard mask layer; and
    patterning the core layer.

12. The method of claim 11, wherein forming the spacers on the first and second hard mask layer further comprising:
    forming the spacers on a sidewall of the patterned core layer; and
    removing the patterned core layer.

* * * * *